(12) United States Patent
Deck

(10) Patent No.: US 10,190,871 B2
(45) Date of Patent: Jan. 29, 2019

(54) PRECISION POSITIONING SYSTEM USING A WAVELENGTH TUNABLE LASER

(71) Applicant: Zygo Corporation, Middlefield, CT (US)

(72) Inventor: Leslie L. Deck, Middletown, CT (US)

(73) Assignee: Zygo Corporation, Middlefield, CT (US)

(*) Notice: Subject to any disclaimer, the term of this patent is extended or adjusted under 35 U.S.C. 154(b) by 0 days.

(21) Appl. No.: 15/616,075

(22) Filed: Jun. 7, 2017

(65) Prior Publication Data

US 2017/0356739 A1    Dec. 14, 2017

Related U.S. Application Data

(60) Provisional application No. 62/347,141, filed on Jun. 8, 2016.

(51) Int. Cl.
  *G01B 9/02*   (2006.01)
  *H01S 5/06*   (2006.01)
  *G01B 11/14*   (2006.01)

(52) U.S. Cl.
  CPC .............. *G01B 11/14* (2013.01); *G01B 9/02* (2013.01); *H01S 5/06* (2013.01)

(58) Field of Classification Search
  CPC .............. G01B 11/14; G01B 9/02; H01S 5/06
  See application file for complete search history.

(56) References Cited

U.S. PATENT DOCUMENTS

| 9,025,160 B2 | 5/2015 | Moore et al. |
| 2002/0109851 A1* | 8/2002 | Deck ............... G01B 11/06 356/512 |
| 2008/0285053 A1* | 11/2008 | Tang ............... G01B 9/02004 356/511 |
| 2011/0108720 A1 | 5/2011 | Ford et al. |

(Continued)

FOREIGN PATENT DOCUMENTS

| CN | 103259175 | 8/2013 | ............ H01S 3/067 |
| WO | WO 2008/042866 | 4/2008 | ............ G01J 3/28 |
| WO | WO 2013/012495 | 1/2013 | ............ G01V 8/16 |
| WO | WO 2015/183310 | 12/2015 | ............ G01V 8/10 |

OTHER PUBLICATIONS

Brett Bochner, "Modelling the Performance of Interferometric Gravitational-Wave Detectors with Realistically Imperfect Optics", Thesis submitted to the Department of Physics in partial fulfillment of requirements for the degree of Doctor of Philosophy, Massachusetts Institute of Technology (Jun. 1998).

(Continued)

*Primary Examiner* — Dominic J Bologna
(74) *Attorney, Agent, or Firm* — Fish & Richardson P.C.

(57) ABSTRACT

A method for determining characteristics of a test cavity, the method includes for each of a plurality of optical frequencies within a bandwidth of a tunable laser, measuring interference signals from the test cavity and a reference cavity having a known characteristic. The method includes determining values for the plurality of optical frequencies from the measured interference signals from the reference cavity and the known characteristic of the reference cavity, and determining the characteristic of the test cavity using the determined values of the plurality of optical frequencies.

22 Claims, 8 Drawing Sheets

(56) References Cited

U.S. PATENT DOCUMENTS

| | | | | |
|---|---|---|---|---|
| 2011/0292405 A1* | 12/2011 | Dunn | ................ | G01B 9/02004 356/511 |
| 2013/0021615 A1* | 1/2013 | Duncan | ................ | G01H 9/004 356/477 |
| 2015/0115146 A1 | 4/2015 | Jones | | |

OTHER PUBLICATIONS

M. Bodine et al., "Superresolved swept-wavelength interferometry using frequency estimation methods," Optics Letters, vol. 41, No.1, pp. 159-162 (Jan. 1, 2016).

W. Drexler, et. al., "Optical coherence tomography today: speed, contrast, and multimodality," Journal of Biomedical Optics, vol. 19, No. 7, pp. 071412-1-071412-34 (Jul. 2014).

E. Morel, et. al., "Interferometric system based on swept source-optical coherence tomography scheme applied to the measurement of distances of industrial interest," Optical Engineering, vol. 55, No. 1, pp. 014105-1-014105-7, (Jan. 2016).

Gauss-Newton Algorithm, Wikipedia, https://en.wikipedia.org/wiki/Gauss%E2%80%93Newton_algorithm, downloaded on Jun. 1, 2017.

International Search Report and Written Opinion of International Application No. PCT/US2017/036343 dated Sep. 7, 2017.

Taiwan Office Action for Taiwan Application No. 106118824 dated Jun. 6, 2018.

* cited by examiner

PRECISION POSITIONING SYSTEM USING A WAVELENGTH TUNABLE LASER

CLAIM OF PRIORITY

This application claims the benefit of the priority date of U.S. Provisional Patent Application No. 62/347,141, entitled "PRECISION POSITIONING SYSTEM USING A WAVELENGTH TUNABLE LASER," filed on Jun. 8, 2016, pursuant to 35 USC § 119. The entire content of this provisional application is herein incorporated by reference.

BACKGROUND

The expanding demand for optical coherence tomography (OCT) in medical and industrial markets has driven unprecedented advances in high-speed, widely-tunable, narrow-linewidth, semiconductor lasers. These new devices present a unique enabling technology for industrial distance metrology applications.

Interferometry is a useful tool for distance measurement since the only fundamental limit to measurement precision is photon statistics. The LIGO interferometer is a good example of the precision that can be reached with interferometry with care (and a lot of money), providing sensitivity to displacement noise densities of less than $10^{-6}$ pm/Hz$^{1/2}$. In practical industrial applications however, measurement precision can often be limited due to other effects such as environmental or electronic noise or the measurement/processing techniques employed.

Three measurement techniques typically used in OCT include time-domain OCT (TD-OCT), and spectral domain techniques, including Fourier domain OCT and Swept Source OCT (SS-OCT). In TD-OCT, an interference signal from a spectrally broad source is generated by displacing a reference mirror in the interferometer. In FD-OCT, interference of various spectral components of a spectrally broad source is observed with a spectrometer, In SS-OCT, the interference is sampled rapidly during a high speed sweep over a broad optical spectrum using a tunable laser. The high speed sweep can include a sequence of measurements at different, discrete frequencies or a continuous sweep through a continuum of frequencies. In the case of a stepped laser having different, discrete frequencies, each "step" can correspond to a new lasing mode that results in a different optical frequency.

Spectral domain techniques have been proven to have greater sensitivity than time domain techniques due to the fact that they are capable of collecting signals from all sample depths during the entire acquisition time. This advantage coupled with a method for determining the absolute wavelength and a physical-model based analysis provides significantly improved distance measurements for industrial distance measurement applications.

SUMMARY

Systems and methods that enable features for an ultra-high precision distance measuring interferometer (DMI) using a swept wavelength laser are described herein. Briefly, for each of a number of optical frequencies within a bandwidth of a tunable laser, one or more fixed, reference cavities with absolutely known characteristics and one or more test cavities with unknown characteristics are illuminated to produce an interference signal from each cavity. The interference signals from the reference cavities are fit to a physical model of the interference to evaluate the value of the optical frequency at each of the number of optical frequencies. Using the derived optical frequencies, the interference signal from the unknown test cavities are fit to a mathematical model of their interference to evaluate the unknown characteristics of the test cavity.

In one aspect, a method for determining a characteristic of a test cavity, the method includes, for each of a plurality of optical frequencies within a bandwidth of a tunable laser, measuring interference signals from the test cavity and a reference cavity having a known characteristic. The method includes determining values for the plurality of optical frequencies from the measured interference signals of the reference cavity and the known characteristic of the reference cavity, and determining the characteristic of the test cavity using the determined values of the plurality of optical frequencies.

Implementations can include one or more of the following features. Measuring the interference signals can include sweeping through the plurality of optical frequencies within the bandwidth of the tunable laser as a function of time and measuring the interference signals for both the test cavity and the reference cavity for each of multiple, different times during the sweeping so that the measured signals for the test and reference cavities at each of the multiple, different times correspond to different ones of the plurality of optical frequencies within the bandwidth of the tunable laser. The method can further include measuring interference signals from a second reference cavity having a second known characteristic. Determining the values for the plurality of optical frequencies can include fitting the measured interference signals of the reference cavity and the second reference cavity obtained for each of the plurality of optical frequencies within the bandwidth of the tunable laser to a mathematical model based on the known characteristics of the reference cavity and the second reference cavity. The reference cavity and the second reference cavity can have different gap sizes. Fitting the measured interference signals of the reference cavity and the second reference cavity can include using regression analysis of the interference signals to a mathematical model to determine the values for the plurality of optical frequencies. The mathematical model can include an analytical function. Determining the values for the plurality of optical frequencies can include using Gauss-Newton optimization. Determining the values for the plurality of optical frequencies can include using Gauss-Newton optimization, and determining a Jacobian of partial derivatives of the measurement interference signals with respect to the optical frequency based on the analytical function.

Determining the values for the plurality of optical frequencies can be based on an initial estimate for the plurality of optical frequencies. A single reference cavity can be used and the plurality of optical frequencies can be known to within half of a free spectral range of the reference cavity. An error in the determined characteristic of the test cavity caused by uncertainty in the values for the plurality of optical frequencies can be reduced. The characteristic can include gap size within the test cavity, the reference cavity can include a fixed reference cavity, and the known characteristic of the reference cavity can include a gap size of the fixed reference cavity. The method can further include determining a second characteristic of the test cavity, the second characteristic can include a velocity of the test cavity. Initial values for the plurality of optical frequencies can be known to within half of a free spectral range of the reference cavity, and the values for the plurality of optical frequencies can be determined directly from the interference signals of the reference cavity. Determining the characteristic of the test cavity using the determined values of the plurality of optical frequencies can include using phase analysis of multiple overlapping segments within the plurality of optical frequency, each segment containing data points that cover a portion of the plurality of optical frequencies within the bandwidth of the tunable laser. A velocity of the test cavity can be constant within a sampling of the data points in the segment.

In another aspect, an interferometry system for characterizing a test cavity, the system includes a reference cavity having a known characteristic, a tunable laser having a plurality of optical frequencies within a bandwidth, optical elements to direct each of the plurality of optical frequencies within the bandwidth of the tunable laser to the test cavity and the reference cavity, an acquisition system configured to be synchronized to the tunable laser to receive measured interference signals from the reference cavity and the test cavity at each of the plurality of optical frequencies; and an electronic processor coupled to the acquisition system to receive the interference signals, and configured to determine values for the plurality of optical frequencies from the measured interference signals and the known characteristic.

Implementations can include one or more of the following features. The electronic processor can be further configured to determine a characteristic of the test cavity based on the measured interference signals for the test cavity. The system can include one or more additional reference cavities having known characteristics.

The system can include an intensity monitor to compensate for high speed laser intensity fluctuations in the tunable laser. The system can include a fiber distributor configured to distribute light from a tunable laser to the reference cavity and the test cavity. The test cavity can be remotely positioned from the fiber distributor. The reference cavity can have a confocal design to minimize dispersion. The values of the plurality of optical frequencies determined by the electronic processor can have an uncertainty of less than 20 MHz for a tunable laser having a root-mean-square optical frequency variation of about 350 MHz. The electronic processor can be configured to determine a characteristic of the test cavity using the determined values of the plurality of optical frequencies and phases extracted from data of multiple overlapping segments within the plurality of optical frequency, each segment containing data points that cover a portion of the plurality of optical frequencies within the bandwidth of the tunable laser.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
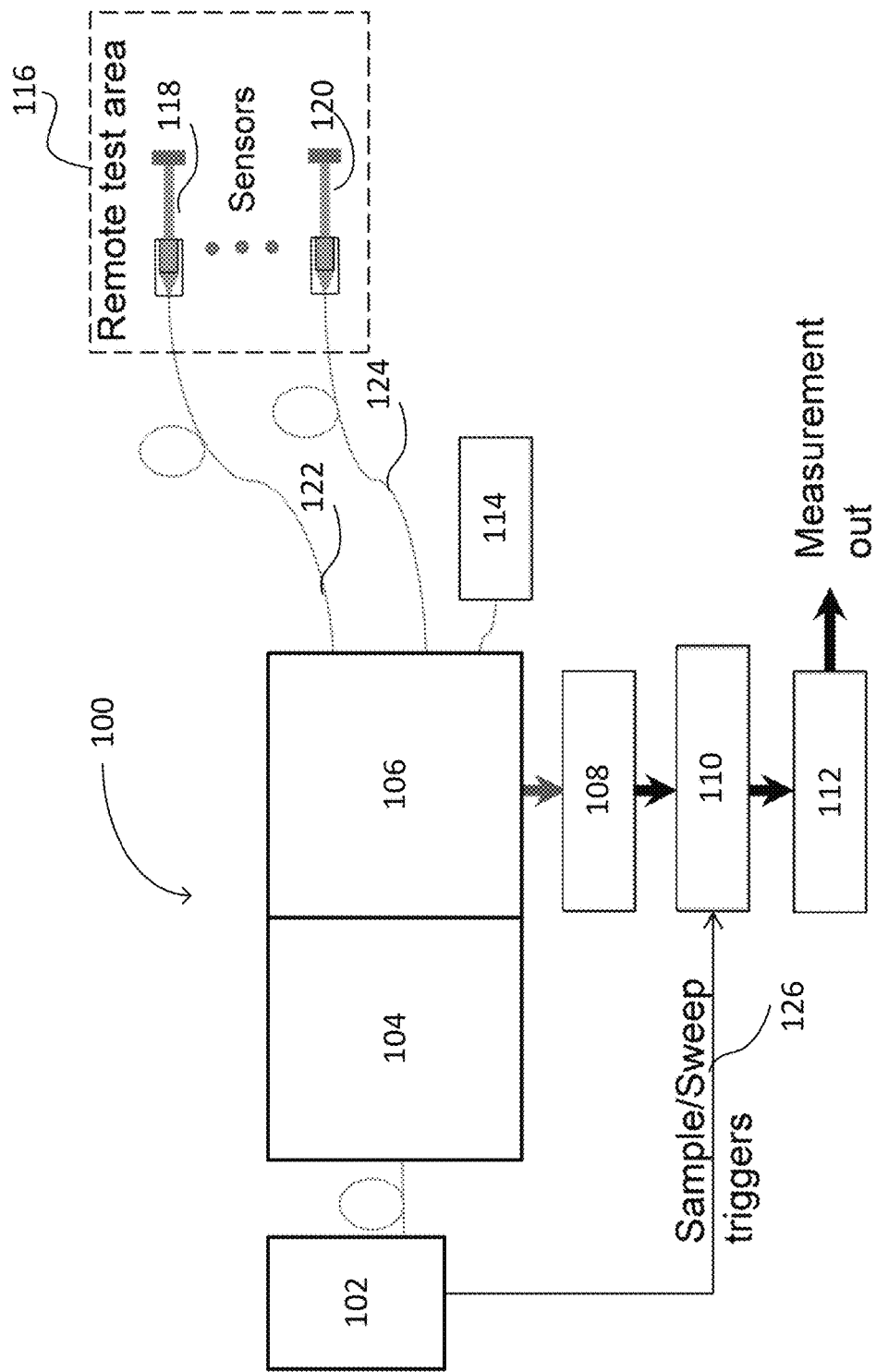
FIG. 1A is a schematic diagram of a measurement system.

The methods and systems disclosed herein permit industrial ultra-high precision DMI applications using swept sources. Swept sources are tunable lasers having a bandwidth, across which a high speed sweep can be made. The high speed sweep can be a smooth continuous variation of wavelength or include a sequence of different, discrete frequencies within the bandwidth.

A typical SS-OCT analysis involves transforming an interference signal acquired during a sweep using Fourier and/or Hilbert transform techniques to produce a complex reflectivity spectrum. The frequency axis of the spectrum represents the interrogation depth. Such an approach can be convenient when the cavity is a scattering volume, such as a biological sample, since each sweep then provides the complex reflectivity as a function of depth, thereby delineating the boundaries of biological features. The interference signal is usually filtered to minimize error contributions due to finite, non-uniform sampling and other sources of out-of-band noise such as cavity motion or tuning irregularities. A Fourier approach assumes the sweep varies linearly in optical frequency. Often, additional monitoring of the sweep is performed to maintain this linearity, for example through the use of Fiber Bragg Gratings (FBG) or absorption cells. The assumed linearity of the sweep can make it difficult for Fourier approaches to directly account for cavity motion.

Industrial applications typically involve the measurement of the distance between two surfaces, with little or no volume scattering in the medium between them. If the cavity medium is air, turbulence can be a significant source of apparent cavity length measurement error since the interferometric measurand is optical length rather than physical length. Turbulence can change the optical index of air. Often refractometers are used to sample the atmospheric optical index to compensate for this variability. More sophisticated and costly approaches to compensate for index variations can involve dispersion interferometry, but air turbulence is often the dominant error source.

Next generation lithography systems (i.e. EUV lithography) are examples of industrial applications that use extremely high performance displacement sensors. Since EUV systems work in vacuum to minimize scatter of EUV light, the displacement sensors can ignore turbulence. The methods and systems described herein provide much higher performance levels than standard displacement sensors, and are suitable for EUV systems.

In addition, most industrial applications also involve motion, for example, the cavity gap can change at some velocity. A velocity of the cavity gap refers to the rate of change of the gap size of the test cavity. It is important for the sensor to maintain precision in the presence of cavity motion.

In other words, the performance level (e.g., in terms of root mean square optical frequency uncertainty) afforded by swept laser systems is not fully capitalized by the current processing methods to yield a corresponding improvement in the accuracy of DMI measurements. The methods and systems disclosed herein improve the accuracy of the DMI measurements by improving the processing of the measured interferometry data.

A distance measurement application can involve measuring an unknown cavity gap and/or gap motion of an interferometric cavity as precisely as possible. Such an application can involve obtaining interference signals during a swept-wavelength acquisition. A swept-wavelength acquisition involves obtaining interference signals at each of a number of different, discrete optical frequencies within a bandwidth of a tunable laser (or "swept source"). A weighted fit of the interference signals to a mathematical model of the test cavity (if available) can be used. In such methods, the unknown parameters are varied until the best fit is obtained.

A fit merit function based on the sum of the weighted squares of the deviations (or the residuals) between model and measurement at each frequency point of the sweep allows fit optimizations in a least-squares (LS) sense using a variety of numerical fitting methods. While least square regression methods are the most common, other regression analysis methods can be used, for example, least absolute deviation, percentage deviations, nonparametric regression, distance metric learning and Bayesian methods. Such numerical fitting methods include the Gauss-Newton method, which is detailed in the embodiments disclosed below, QR decomposition, and gradient methods, among others. The parameter values which optimize the merit function are taken to be the best representation of their "true" values. Each intensity sample is treated optimally by assigning weights according to their statistical uncertainty.

The inventor recognizes that the optical frequency is only approximately known at each point in the sweep and is often the greatest source of error in SS-OCT applications. The methods and systems disclosed herein minimize this source of uncertainty, and improve the accuracy with which various characteristics of test objects can be determined in various SS-OCT applications.

FIG. 1A shows a system 100 that can be used to measure characteristics of a test object. The system 100 includes a swept laser source 102 which feeds a fiber distributor 104. The fiber distributor 104 distributes light received from the swept laser source 102 into a desired number of channels. Some of the channels can be used as test sensors (i.e., a test object, or test cavity). These sensors can be remotely positioned from the body of system 100 in a remote test area 116 using fibers 122 and 124. Only two test sensors 118 and 120 are shown schematically in the test area 116. One or more channels can be used as optical frequency monitor (OFM) cavities 114 and other monitors. Splitters 106 both send light from the swept laser source 102 and receive measurement light from the test sensors 118 and 120 and various monitors 114. To improve light efficiency, the splitters 106 could be replaced with circulators. The interference light from the sensors and monitors are directed by the splitters 106 into detectors 108.

The interference intensity from all channels (i.e., both the test sensors channels and the reference channels) is simultaneously and synchronously detected at detectors 108 with an acquisition system 110 that is synchronized with the swept laser 102 by electronic triggers 126. The one or more OFM cavities 114 can serve as fixed reference cavities which are provided with specific, absolutely known gaps.

After each sweep, during which the interference signals from these reference cavities are acquired simultaneously and synchronously with the test cavities, the intensity signals are processed by a processor 112 to first determine the values of the optical frequencies at each point of the sweep and to determine the unknown characteristics of all the test sensors based on the determined values of the optical frequencies.

The measurement rate for each sensor is equal to the sweep repetition rate of the swept laser. For example, if the swept laser sweeps through 91 nm of bandwidth in 5000 steps at a repetition rate of 20 kHz, 100 million (5000×20 kHz) intensity measurements will be obtained from the test object in 1 second (i.e., at 100 MHz). The unknown characteristics can include parameters like the dimension of the gap in the test sensor, a velocity of a change in the dimension of the gap, or a change in velocity (i.e., acceleration) of the change of the gap dimension.

The methods and systems described herein involve first determining the optical frequency at each point in the sweep by doing a LS analysis of the intensity signals to a mathematical model. The unknown parameter solved in the LS analysis is the optical frequency. After the optical frequency at each point in the sweep is determined, the second step involves using the determined optical frequencies to evaluate characteristics of the test cavities.

Advantageously, in addition to optimally using the measurement data to extract one or more characteristics of test objects with a high accuracy, the optical frequency sweep analyzed using the method described above can also have an arbitrary shape (e.g., a linear sweep is convenient, but not necessary). In addition, other cavity characteristics, such as velocity, which can significantly influence the measurement of the gap length if not accounted for, can be simultaneously solved for (in addition to gap dimensions) during a sweep.

As the final gap precision can depend sensitively on the precision with which the swept wavelengths are known, the methods and system described herein maximize measurement accuracies.

Determination of Optical Frequencies

The mathematical details of an embodiment are described below. First, for simplicity, all cavities are assumed to be Fabry-Perot dielectric cavities, which is formed from two dielectric surfaces. In general, however, any cavity can be used as long as the appropriate model is applied.

The Airy formula for the reflected interference signal from a parallel plate Fabry-Perot cavity of gap G and velocity V during a wavelength sweep is $$I(t, \lambda, G, V) = \left| \frac{r_1(\lambda(t)) + r_2(\lambda(t)) e^{i[\theta(t,\lambda(t),G,V)]}}{1 + r_1(\lambda(t)) r_2(\lambda(t)) e^{i[\theta(t,\lambda(t),G,V)]}} \right|^2 \quad (1)$$

where $r_1(\lambda)$ and $r_2(\lambda)$ are the complex field reflection coefficients of the first and second surfaces, respectively, and the phase $\theta(t, \lambda, G, V)$ $$\theta(t, \lambda, G, V) = \frac{4\pi}{\lambda}(G + Vt)\cos(\beta) \quad (2)$$

where β is the angle the refracted ray makes with the first surface normal. The wavelength dependence of the reflection coefficients stems from the wavelength dependence of the refractive indices of the media before and after the surfaces. For convenience, normal incidence illumination on a pure dielectric cavity is assumed. Eq. (1) can then be rewritten as $$I(t, G, V) = \left| \frac{\sqrt{\rho_1(v(t))} - \sqrt{\rho_2(v(t))} e^{i[\theta(t,v(t),G,V)]}}{1 - \sqrt{\rho_1(v(t))} \sqrt{\rho_2(v(t))} e^{i[\theta(t,v(t),G,V)]}} \right|^2 \quad (3)$$

where $v(t)$ is the optical frequency which changes in time during the sweep, $\rho_{1,2}(v(t))=|r_{1,2}(v(t))|^2$ are the intensity reflectivity of the first and second bounding surfaces as a function of optical frequency respectively, G and V are the starting cavity gap and mean velocity during the sweep and the π phase change upon reflection off the second surface has been explicitly incorporated.

Replacing $v(t)$ with $v$ for clarity, the phase evolution $\theta(t, v, G, V)$ during a wavelength sweep is modelled here as $$\theta(t, v, G, V) = \frac{4\pi}{c} v(G + Vt) \quad (4)$$

For fitting convenience, a Fourier expansion of the Airy formula is used to describe the interference signal $I(t, v, G, V)$:

$$I(t, v, G, V) = A(v) - B(v) \sum_{k=1}^{K} (R(v)^{k-1} \cos[k\theta(t, v, G, V)]) \quad (5)$$

Eq. (5) agrees with Eq. (3) to better than 0.1% to second order (K=2) for typical dielectric cavities. The second order signals arise from a further reflection of the measurement beam. After reflecting once off the test surface, the measurement beam can reflect off a back surface of the reference surface before reflecting off the test surface a second time.

In Eq. (5), A and B are the DC and AC intensity terms which may depend on wavelength, and the reflectivity $R(v) = \sqrt{\rho_1(v)\rho_2(v)}$. Since the wavelength dependence of the reflectivity is small for typical dielectrics, one can usually replace R with its mean value in the range of optical frequencies covered by sweep, with little error.

The number of sine and cosine evaluations, the most computationally intensive part of the calculation, is multiplicative with order. For typical cavities, a second order analysis is sufficient since the value of R is typically very small.

To facilitate a least-squares regression approach, a merit function for evaluating the optical frequency $v_i$ at point i of N points in a sweep (i=1 ... N) of a system with j=1 ... M known reference cavities, can be expressed as (note that i is now a surrogate for time)

$$\chi^2_{(v_i)} = \sum_{j=1}^{M} \left[ \frac{D_{ij} - I(v_i, G_j)}{w_j} \right] \quad (6)$$

Here, $D_{ij}$ is the intensity signal obtained experimentally at point i from reference cavity j and $I(v_i, G_j)$ is evaluated using Eq. 5. For the fixed reference cavities, velocity $V_j$ is identically zero, and the gaps $G_j$ are absolutely known. The only unknown is $v_i$. Following a Gauss-Newton optimization method, given a starting value for $v_i$, the parameter update is $$\delta v_i = [J^T W J]^{-1} J_T W [D - I(v_i, G_j)] \quad (7)$$

where W is a diagonal weighting matrix with $W_{ii} = 1/w_j^2$. D is a M×1 vector of measured intensities $D_i$ (one for each reference cavity) at point i in the sweep. J is a M×1 Jacobian of partial derivatives $$J = \frac{\partial I}{\partial v}.$$

Note that bolded variables represent vectors or matrices. When using the reference cavities to determine the optical frequency at each time point of the wavelength sweep, the AC, DC and reflectivity terms may be a function of optical frequency, as indicated by Eq. (5). However, the reference cavities are part of the internal system, their dependence on the optical frequency is expected to either not change, or will change in a known way such that they can be parametrized to provide analytical approximations with explicit dependence on optical frequency. The partial derivatives of all the terms in Eq. (5) can then be evaluated.

For cases where the analytical dependence to the optical frequency is difficult to obtain, an expedient approach is to provide a correction to each intensity sample $D_{ij}$ that compensates for any optical frequency dependence. These corrections can be obtained with factory calibrations, as they are expected to be stable, and the optical frequency jitter is expected to be small (e.g., ~350 MHz rms). Incorporating these corrections makes it possible to treat the AC, DC and reflectivity terms as constants relative to changes in optical frequency (or at least constant within a sweep) and all the optical frequency dependence in Eq. (5) is in the cosine term. This approach will be used below when evaluating the test cavity unknowns. After the Jacobian of the partial derivatives are taken, Eq. (7) is evaluated to yield $\delta v_i$. The update (i.e., $\delta v_i$) is then added to the initial parameter estimate to produce the next estimate $v'_i$ via $v'_i = v_i + \delta v_i$. This procedure is iterated until a termination criterion is satisfied. For sufficiently good starting values, a single iteration is often enough. This procedure is followed for optical frequencies at each point in the sweep.

Once the measured optical frequencies $v'_i$ for all points in the sweep are determined, the unknown parameters (e.g., gap, velocity, etc.) for the test cavities are determined. Assuming there are two unknowns (gap and velocity), a merit function for evaluating the two unknowns can be expressed as $$\chi^2_{(G,V)} = \sum_{i=1}^{N} \left[ \frac{D_i - I(t_i, v'_i, G, V)}{w_i} \right]^2 \quad (8)$$

where i=1 ... N runs through all samples in the sweep. Following a similar Gauss-Newton optimization method, given starting values for the two parameters G and V, the parameter update vector is $$\begin{bmatrix} g \\ v \end{bmatrix} = [J^T W J]^{-1} J^T W [D - I(t, v', G, V)] \qquad (9)$$

where W is a diagonal weighting matrix with $W_{ii}=1/w_i^2$. For simplicity, identical weights of $w_i=1$ can be assigned for all i. D is the calibration-corrected intensity signal (an N×1 vector) and J is the N×2 Jacobian of parameter partial derivatives. Since the calibrations remove the explicit dependence of the intensity on optical frequency, the AC, DC and reflectivity terms in Eq. (5), which can vary as a function of the optical frequency, are treated as constants relative to changes in the gap (g) and velocity (v).—Once again, all the dependences with respect to g and v in Eq. (5) are in the cosine term. After the Jacobian of the partial derivatives are taken, Eq. (9) is evaluated to yield g and v. The update $$\left(\text{i.e.,} \begin{bmatrix} g \\ v \end{bmatrix}\right)$$

is then added to the initial parameter estimates $$\left(\begin{bmatrix} G \\ V \end{bmatrix}\right)$$

to produce the next estimate via $$\begin{bmatrix} G' \\ V' \end{bmatrix} = \begin{bmatrix} G \\ V \end{bmatrix} + \begin{bmatrix} g \\ v \end{bmatrix}.$$

This procedure is iterated until a termination criterion is satisfied. For sufficiently good starting values, a single iteration is often enough. This procedure is followed for all the test cavities.

One of the advantages of having a mathematical model of the cavity is that additional unknowns x can be simultaneously solved for by including their sensitivities $$\frac{\partial I}{\partial x}$$

in the Jacobian. For example, if desired, the AC and DC amplitudes can be allowed to float using the Jacobian $$J = \begin{bmatrix} \frac{\partial I}{\partial B} & \frac{\partial I}{\partial A} & \frac{\partial I}{\partial G} & \frac{\partial I}{\partial V} \end{bmatrix},$$

evaluating $$\begin{bmatrix} b \\ a \\ g \\ v \end{bmatrix} = [J^T W J]^{-1} J^T W [D - I(t, v', B, A, G, V)]$$

and then updating the parameters via $$\begin{bmatrix} B' \\ A' \\ G' \\ V' \end{bmatrix} = \begin{bmatrix} B \\ A \\ G \\ V \end{bmatrix} + \begin{bmatrix} b \\ a \\ g \\ v \end{bmatrix}.$$

Though quite flexible, adding parameters can increase the computational burden and may lead to a slower convergence, which could reduce the measurement update rate.

Figure 1B:
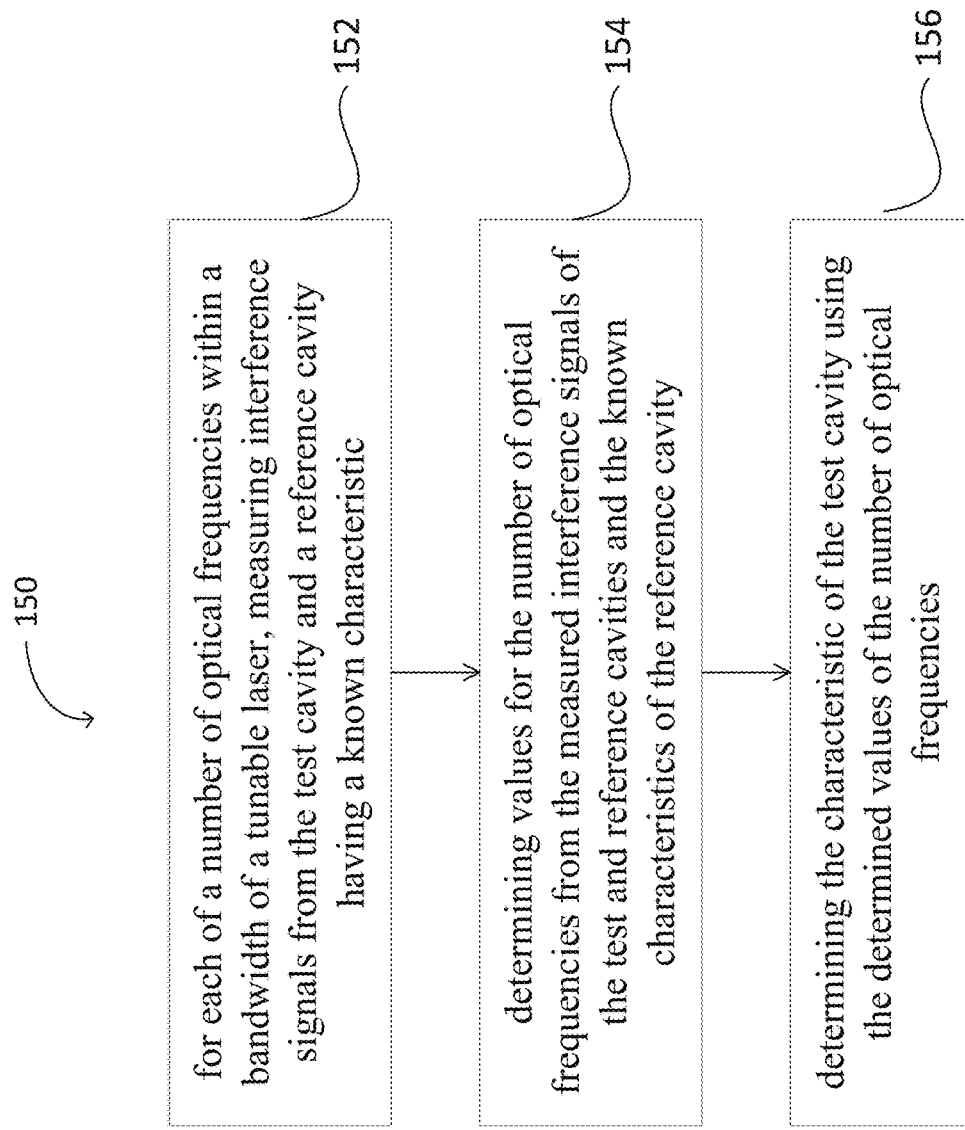
FIG. 1B is a flow chart summarizing how a characteristic from a test cavity is determined.

FIG. 1B shows a flow chart 150 for determining a characteristic of a test cavity. In a step 152, for each of a number of optical frequencies within a bandwidth of a tunable laser, simultaneously measuring interference signals from the test cavity and a reference cavity having a known characteristic. Step 154 involves determining values for the number of optical frequencies using the measured interference signals of the reference cavity and the known characteristic of the reference cavity. This is followed by a step 156, which involves determining the characteristic of the test cavity using the determined values of the number of optical frequencies.

The OFM

The system of M reference cavities is collectively called an Optical Frequency Monitor (OFM). The performance of the OFM can depend sensitively on M and the values of their gaps. In one embodiment, only one cavity is used. The wavelength is then determined from the intensity measurement alone. For establishing the fringe order from the intensity measurement alone, the wavelength must be known a priori to within ½ of the free spectral range (FSR) of the reference cavity. The FSR is the change in optical frequency for which a round trip propagation results in $2\pi$ of phase change. Eq. (5) describes the first order interference intensity as:

$$I = A - B\cos\left(\frac{4\pi G v}{c}\right) \qquad (10)$$

Since the cosine is cyclic, in order for the argument of the cosine to be single valued (i.e., unambiguous) for an OFM that contains a single cavity, the initial uncertainty in the argument should be less than $\pi$. In other words $$\frac{4\pi G \delta v}{c} < \pi \rightarrow \delta v < \frac{c}{4G} \qquad (11)$$

and c/4G is equivalent to ½ FSR. As the OFM cavity gap (G) is reduced, the unambiguous range increases in inverse proportion, as can be seen from Eq. (11).

A single cavity OFM, however, does not provide significant improvement for those optical frequencies for which the interference signal is near an extremum since the sensitivity ($\partial I/\partial v$) is close to zero there.

The wavelength precision from the OFM can be improved and the unambiguous range increased by adding cavities with different gaps, which also helps reduce the sensitivity drop at intensity extrema.

Figures 2A, 2B:
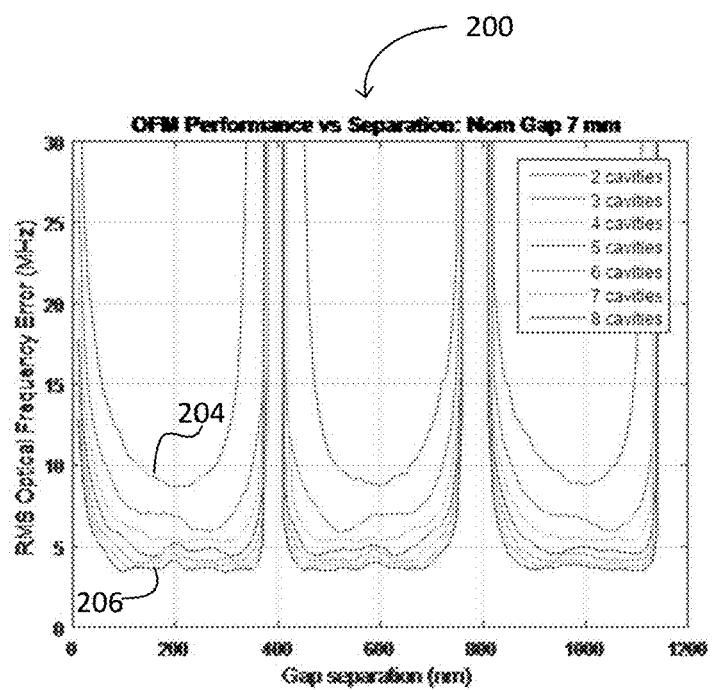
FIG. 2A is a plot of optical frequency uncertainty as a function of gap separation for different numbers of cavities having a nominal gap of 7 mm.
FIG. 2B is a plot of optical frequency uncertainty as a function of gap separation for different numbers of cavities having a nominal gap of 12.7 mm.

There are a large number of gap options, but as an illustration, FIG. 2 plots the residual rms optical frequency uncertainty values for OFMs having a variety of cavities with constant gap separations. The example depicted in FIG. 2 assumes a typical initial rms optical frequency uncertainty of 350 MHz (~2.5 pm) and a 90 nm sweep around Optical frequency errors plots 200 for an OFM having a nominal cavity gap of 7 mm and different numbers of cavities are shown in FIG. 2A. Optical frequency errors plots 202 for an OFM having a nominal cavity gap of 12.7 mm and different numbers of such cavities are shown in FIG. 2B.

Comparing FIG. 2A and FIG. 2B, a number of general principles can be gleaned: OFMs with a longer nominal gap and more cavities provide the broadest unambiguous range and smallest optical frequency error. Plot 204 is the optical frequency error obtained for an OFM having two cavities and plot 206 is obtained from an OFM having eight cavities. Plot 208 in FIG. 2B shows an OFM having two cavities and plot 210 shows an OFM having eight cavities. FIGS. 2A and 2B show that good performance is achievable with a modest number of cavities (e.g., two cavities) for gap separations equal to odd multiples of $\bar{\lambda}/8$, which is 196 nm for $\bar{\lambda}=1570$ nm, as used in this example.

By suitably selecting the number of cavities and the nominal gap separation, one can tailor the OFM to provide unambiguous solutions of optical frequency over a range that is larger than the a priori uncertainty of all optical frequencies over the swept spectral band. Final rms optical frequency uncertainties of 10 MHz or less are readily attainable, a remarkable improvement from the initial rms optical frequency uncertainty of 350 MHz.

As the final performance of the system can depend sensitively on the optical frequency uncertainty, the OFM cavities can thus be specially designed to further minimize error sources. For example, Eq. (5) recognizes the possibility of spectrally dependent DC and AC terms (i.e A(v) and B(v)). This dependency can arise from wavelength dependent losses (WDL) due to dispersion effects.

Embodiments Having an Achromatic Channel

Figure 3:
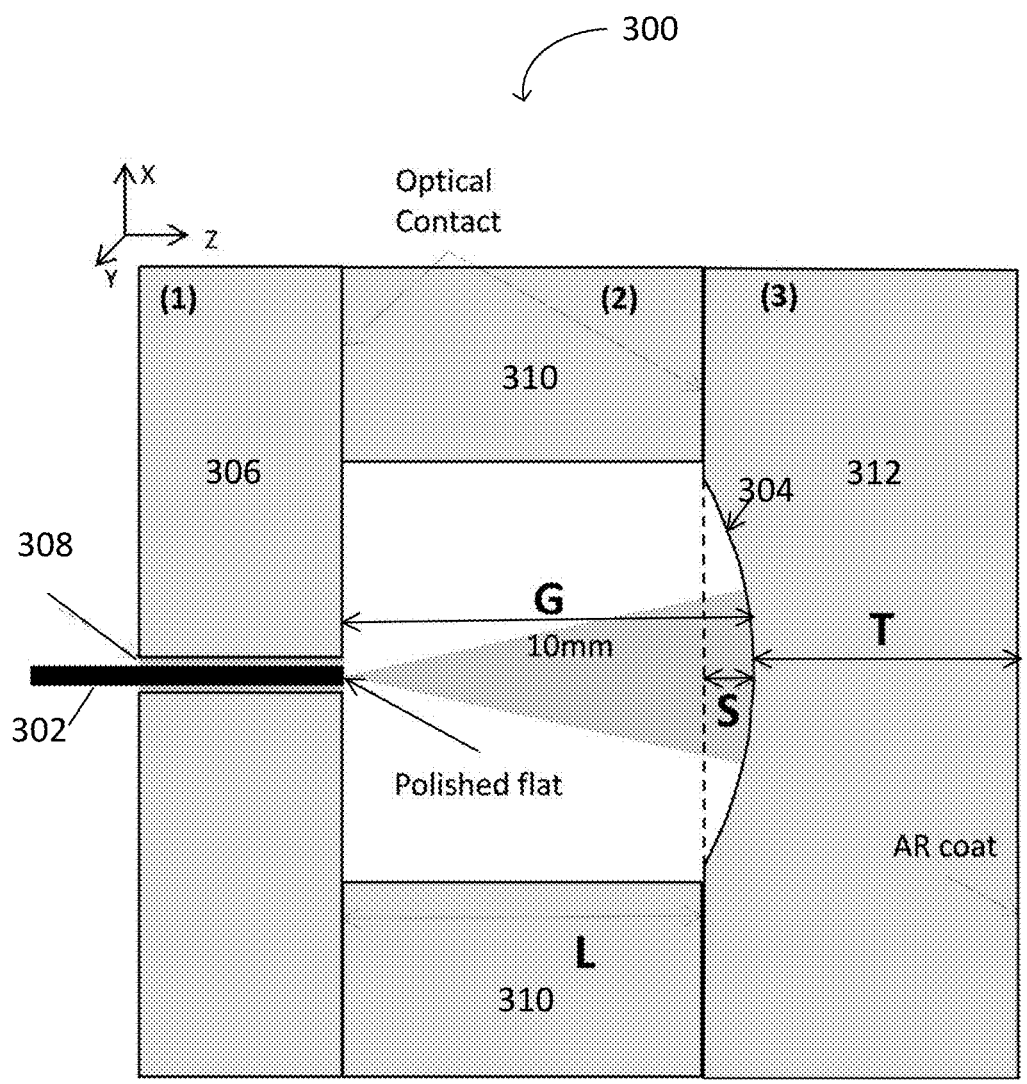
FIG. 3 is a schematic diagram of an ultra-stable fixed gap confocal cavity.

FIG. 3 is a schematic diagram of an ultra-stable fixed gap confocal cavity 300 designed to minimize WDL. The end of a fiber 302 (e.g., a single mode fiber) illuminating the cavity 300 is polished flat (an angle polish can also be used if the fiber is appropriately angled relative to the optical axis) to provide a reference return, while the second surface is a spherical shape 304 that matches the wavefront of the diffracted beam and simultaneously provides the nominal gap G. The fiber 302 is bonded to a base 306, which can be made of Zerodur to minimize thermal disturbances using, for example, a silicon bond 308. Spacers 310 having a length L smaller than G, are used to provide the gap for the cavity 300. A second base 312 having the polished surface 304 can also be made of Zerodur. Though this design provides achromaticity benefits, other cavity types can be used. The nominal gap G of cavity 300 can be, for example, 10 mm.

Calibrations and Other Monitors

It can be advantageous to compensate for system biases through monitoring and calibrations. Some of these calibrations may be channel dependent. For example, one channel can be used to directly measure the laser power during the sweep to compensate for high speed laser intensity fluctuations. Since the laser is common and synchronous with all channels and has a coherence length longer than any of the measured cavities, laser power fluctuations are common mode.

Additionally, WDL from passive components (like splitters, circulators, couplers and the like) can be compensated by a premeasurement of these losses though calibrations. Since these are passive components, their WDL is expected to be stable under suitably stable environmental conditions. Corrections for these losses can be made on a point by point basis during processing. One especially easy method for determining WDL is to measure the return intensity while blocking the second surface cavity reflection (i.e., the reflection from the test surface, or the surface 304 in FIG. 3). This provides direct measurements of WDL by eliminating the interference and residual variations after compensating for intensity fluctuations.

Analysis Sequence

The methods and systems disclosed herein accommodate a wide variety of analyses options, some of which may be better suited for particular measurements depending on the sweep characteristics and the expected range of cavity velocities. A useful metric for evaluating the best analysis mode is the product F of the cavity velocity and the sweep period. This single metric conveniently captures both the dependence on sweep period and cavity velocity. The sweep period is the time the swept source laser takes to cycle through its wavelength bandwidth. $\Gamma$ defines a distance and if that distance is below the resolution limit of the system, velocity information cannot be reliably derived from a single sweep. Since the resolution limit is system dependent, so is $\Gamma$. As $\Gamma$ increases, the dependence of the interference frequency to the change in the optical frequency becomes more nonlinear. In some embodiments, rather than evaluating the velocity from a single sweep, the velocity can also be estimated with finite differences using changes in the size of the gap between adjacent sweeps.

Four possible processing examples are provided below that differ in how the initial estimate of the velocity V and/or gap G is obtained before the measurement is refined with the model analysis disclosed herein. The four examples have different advantages and disadvantages that depend primarily on $\Gamma$.

Figure 4B:
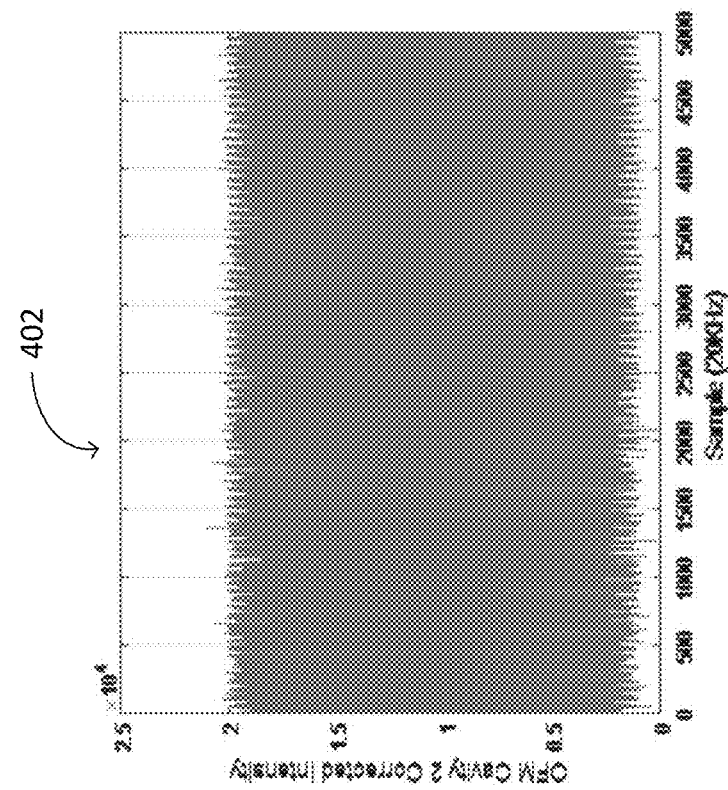
FIG. 4B shows the intensity signal of FIG. 4A after calibration correction.
Figure 4A:
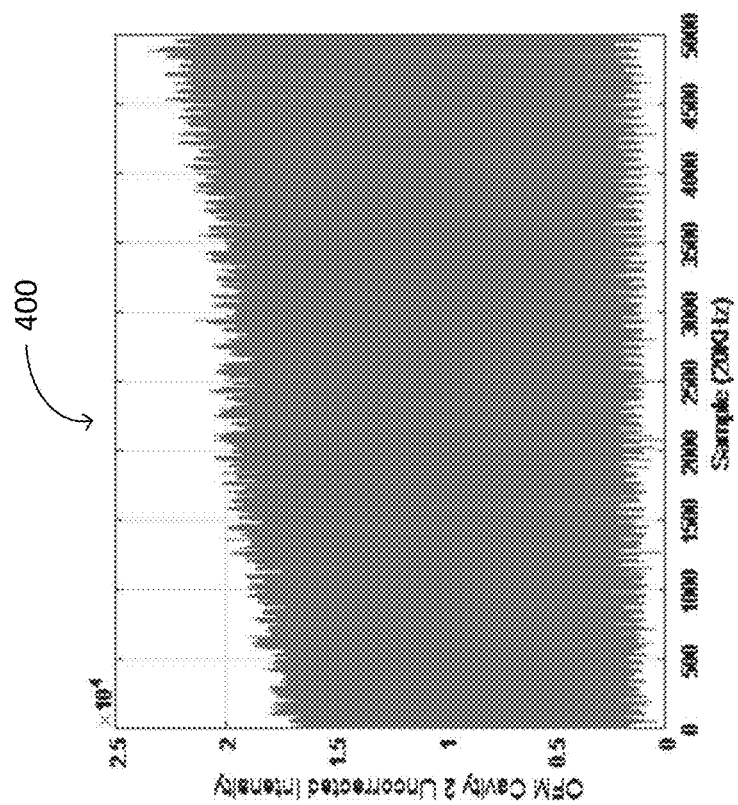
FIG. 4A shows a raw intensity signal prior to correction.

The first sequence is suitable for quasi-linear sweeps with low to moderate $\Gamma$:

1.1) Apply calibration corrections to the sweep intensity signal, FIGS. 4A and 4B below show the results of the corrections described in the illustrative implementation below.
1.2) Fourier analyze the corrected signal to obtain estimates of AC, DC and absolute gap
1.3) Using the model (e.g., Eq. 7 & 9) to refine gap and determine velocity—

A pure Fourier analysis is most affected by velocity, and can lead to poor estimates of the velocity and gap for velocities high enough to produce significant motion during a sweep period.

The second sequence can improve the initial estimate by using a running filter and is suitable for quasi-linear sweeps with moderate F. A running filter basically limits the maximum gap acceleration to within a-priori known values. An example of a running filter is a moving average filter using the recurrence relation $Y_i=aX_i+(1-\alpha)Y_{i-1}$ with $0 \leq \alpha \leq 1$.

2.1) Apply calibration corrections to the sweep intensity signal, as described in FIGS. 4A and 4B below.
2.2) Fourier analyze to obtain estimates of AC, DC and absolute gap
2.3) Correct the gap estimate to account for velocity estimated from a running velocity filter
2.4) Using the model (e.g., Eq. 7 & 9) to refine gap and velocity
2.5) Update running velocity filter using, for example, the recurrence relation above.

The third sequence bypasses a Fourier analysis and applies running filters to the gap and velocity. The velocity estimates are made using finite differencing. With good a-priori knowledge of the cavity motion characteristics, this sequence can be computationally faster. The third sequence is suitable for quasi-linear sweeps with moderate to high cavity velocities:

3.1) Apply calibration corrections to the sweep intensity signal, as described in FIGS. 4A and 4B below 3.2) Estimate the gap and velocity using running gap and velocity filters 3.3) Using the model to refine gap and velocity 3.4) Update running gap and velocity filters The filters use a-priori information about the gap motion to constrain the values to be consistent with this additional information. For example, if the sensor is attached to a servo system whose acceleration and velocity profile limits are known, the filters constrain the solutions to stay within those bounds. The fourth sequence is suitable for nonlinear sweeps, and uses only model analysis. This sequence can accommodate almost any gap motion but can be computationally intensive and may impact measurement speed.

4.1) Apply calibration corrections to the sweep intensity signal, as described using FIGS. 4A and 4B below 4.2) Estimate the gap and velocity using running gap and velocity filters. This step is optional, but it can substantially reduce the gap and velocity space to be searched.

4.3) Refine the gap by finding the extremum of the merit function for gaps around the neighborhood of the gap estimate. The best gap and velocity solution are obtained by evaluating the fit merit function value over a 2D (gap and velocity) space large enough to enclose the solution. The filters in this case are used only to restrict the search space.

4.4) Model analyze (e.g., using Eq. 7 & 9) to refine gap and velocity 4.5) Update running gap and velocity filters. This step is optional, but it can substantially reduce the gap and velocity space to be searched.

A pure Fourier analysis (e.g., the first sequence) can be problematic if the velocity is large enough to produce gap changes of up to a few percent (~2%-3%) of the mean wavelength during a sweep. Correcting the error with various running filters can improve that the tolerance to about 10-15% of the wavelength during a sweep. In principle, the fourth processing sequence can handle any velocity or sweep nonlinearity, but the analysis can take a longer time since the allowable phase space that is searched can be large.

For illustration purposes, assuming a canonical system having a 100 kHz sweep repetition rate (i.e., a sweep period of 10 µs), 5000 points per sweep and a sweep range of 91 nm, low cavity velocity for such a similar can be <3 mm/second, medium cavity velocity can be between 3 mm/second to 20 mm/second, and high cavity velocity can be velocities greater than >20 mm/second.

Many other options are possible, for example the values for the AC and DC amplitudes or R can also be found and/or refined via model analysis if they vary from sweep to sweep.

An Illustrative Implementation

To test some of these principles, measurements using a 4-channel system were made using a commercial swept laser providing nominally linear sweeps over a 91 nm range centered about 1570 nm at 20 kHz and 10 mW of optical power. A 2-channel OFM containing two nominally 11 mm confocal cavities (similar to that shown FIG. 3) with gap separations of 190 nm was constructed. One channel was reserved for intensity monitoring and the last channel was used for measuring an unknown gap of a third fixed length confocal cavity using the procedures described above. Each interference signal sweep contained 5000 intensity samples and the samples were acquired at 100 MHz and digitized to 14 bits.

Due to the laser delivering nominally fixed power, more photons per sample are produced as the wavelength increases during the sweep. The intensity monitor and WDL calibrations correct the intensity signals for the expected linear trend of the AC signal due to the difference in the number of photons, as well as other wavelength dependent variations. FIG. 4A shows a raw intensity signal 400 prior to corrections and FIG. 4B shows a corrected intensity signal 402, illustrating significant interference signal improvement after calibration corrections are applied.

Figure 5:
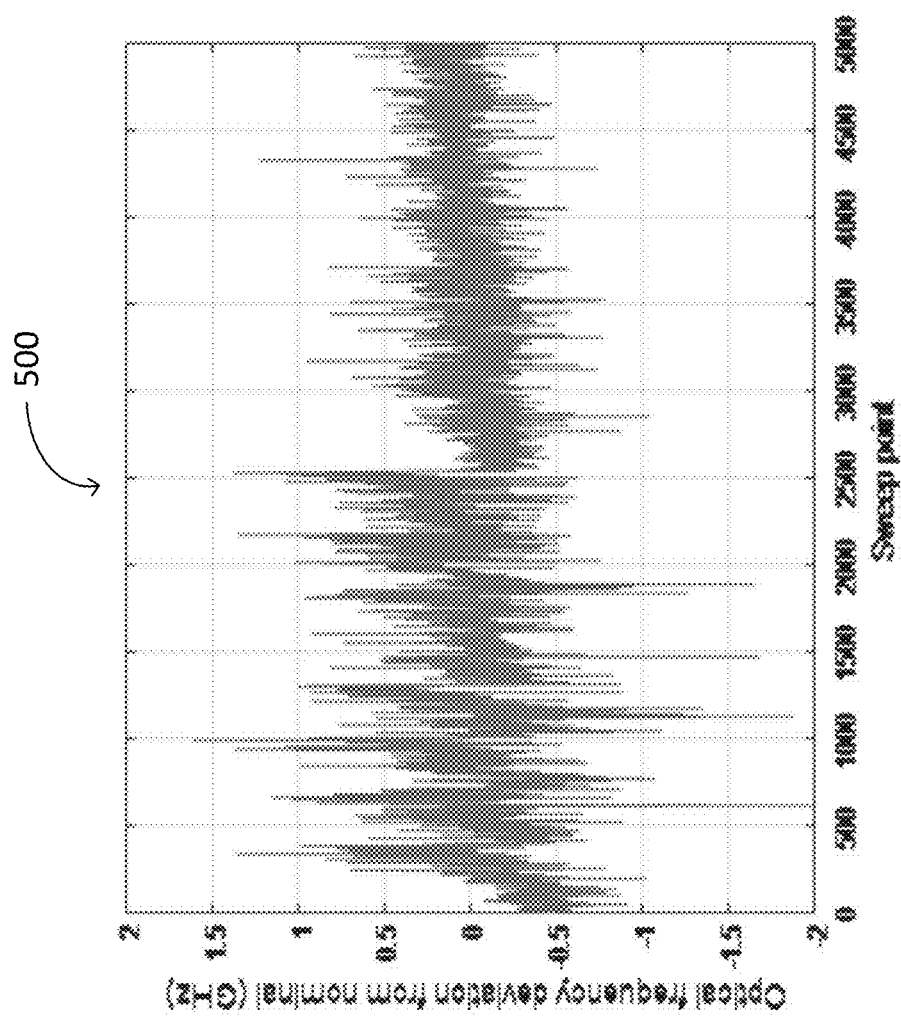
FIG. 5 shows deviation of measured optical frequencies from expected optical frequencies across one wavelength sweep.

FIG. 5 shows a plot 500 of the deviation of the optical frequency obtained from the OFM at each point in the sweep from its expected value. The laser showed much greater optical frequency variability over the first half of the sweep (i.e., between sweep point 0-2500), but the rms optical frequency variation over the whole sweep agreed well with the 350 MHz variation advertised by the laser manufacturer. This property is consistent with the design of the laser, which is formed of two separate solid state lasers each operating over half of the sweep (i.e., a first laser operating between sweep point 0-2500, and a second laser operating between sweep point 2501-5000). The OFM provided good measurements of the instantaneous optical frequency at each point in the sweep.

Figures 6A, 6B:
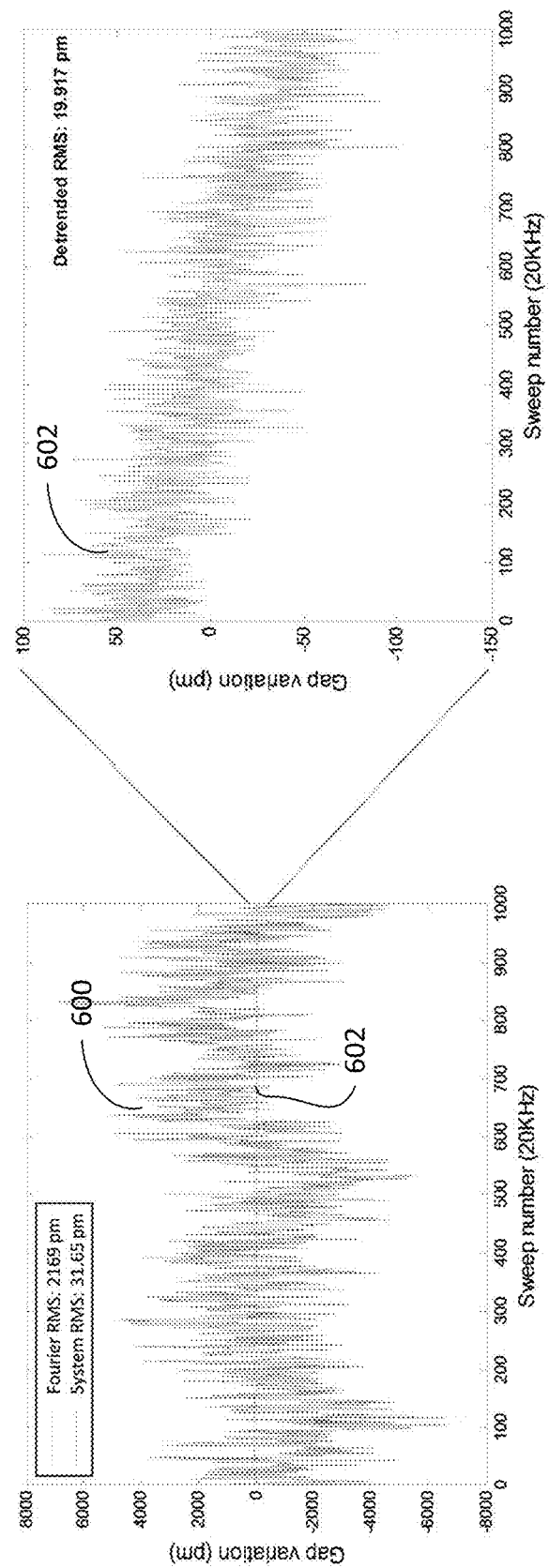
FIG. 6A shows a comparison of test cavity measurements using Fourier processing and the methods disclosed herein.
FIG. 6B shows an expanded view of the test cavity characteristics measured and processed using the methods disclosed herein.

FIG. 6A shows the results achieved using this system to measure the gap of a nominally 11 mm test cavity over 1000 consecutive sweeps (corresponding to a measurement time of 1000/20 kHz=50 ms) using two methods. A plot 600 shows the results obtained using standard Fourier processing assuming a perfectly linear sweep. A plot 602 shows the same data processed with the methods and systems disclosed herein after analyzing the two OFM cavities to more accurately determine the actual optical frequencies.

FIG. 6B is an expanded view of the plot 602, obtained using the methods disclosed herein. The plot 602 highlights the actual cavity drift that occurred during the measurement (about 100 pm, corresponding to a gap contraction rate of 2 nm/second). Removing this linear drift reveals an rms measurement repeatability of about 20 pm (an rms noise density of 0.14 pm/Hz$^{1/2}$) compared to about 2000 pm rms obtained using standard Fourier methods.

Figure 7:
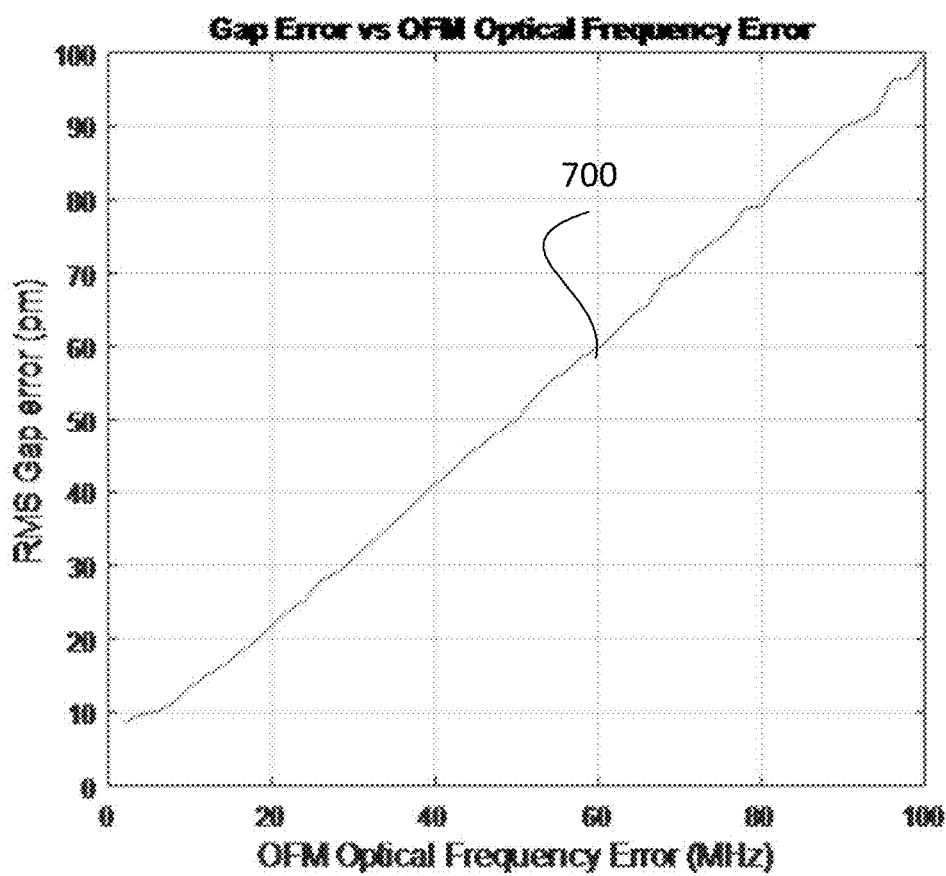
FIG. 7 is a simulation of the experimental system showing the expected root-mean square (rms) gap performance vs. the rms uncertainty in the OFM measured optical frequency.

FIG. 7 shows a plot 700 that simulates an experimental system, showing the expected rms gap measurement uncertainty as a function of rms optical frequency error. The optical frequency uncertainty is the dominant error until the uncertainty drops below 10 MHz, where quantization noise starts to dominate. The simulation suggests that the residual uncertainty in the optical frequency using the experimental 2-channel OFM was about 20 MHz to produce a residual rms gap error of 20 pm.

The methods disclosed herein can be combined with the Fourier analysis and phase extraction techniques similar to those disclosed in U.S. Pat. No. 7,428,685, entitled "Cyclic error compensation in interferometry systems," which is incorporated herein by reference in its entirety. In some embodiments, the following analysis can be used. As an illustration, consider a swept laser having a 91 nm range centered about 1570 nm at 20 kHz. The swept laser makes 20,000 sweeps across the 91 nm range every second. Each sweep can involve 5,000 points spanning the 91 nm wavelength range.

For each sweep, we performed
1. an analysis of the OFM data to determine the optical frequencies at each point (i.e., each of the 5000 points) in the sweep according to the methods described above, and
2. a phase analysis using a Sliding Window DFT (see for example http://www.dsprelated.com/showarticle/776.php) of multiple overlapped segments of the sweep interference signal along with the OFM derived optical frequencies (from step 1 above) to determine the position at each segment (a similar segment analysis is described in U.S. Pat. No. 7,428,685). The amount of segment shift is adjusted to compromise between two competing effects, computing speed and phase robustness, with smaller shifts more immune to phase measurement error but requiring more computation. For example, segments can each have 250 points (e.g., out of the total 5000 points) with 50 points of shift. Then the first segment can cover points 1-250, the second segment can cover points 51-300, and the third segment can cover points 101-350, etc. Thus, points 51-250 overlap in the first and second segments. The choice of segment length can be made so that velocity variations within a segment can be ignored with little error during the data collection of the points in that segment.

At step 2, we can also a) determine the velocity via position differencing, and b) use position and velocity filters to restrict bandwidth and reduce noise. For example, an initial estimate for the velocity is provided at the beginning of each sweep. Piecewise updating is carried out, in which an updated velocity is provided at the beginning of the next sweep by observing how the extracted phase changes across the segments in a particular sweep.

The features of the data processing element can be implemented in digital electronic circuitry, or in computer hardware, firmware, or in combinations of these. The features can be implemented in a computer program product tangibly embodied in an information carrier, e.g., in a machine-readable storage device, for execution by a programmable processor; and features can be performed by a programmable processor executing a program of instructions to perform functions of the described implementations by operating on input data and generating output. The described features can be implemented in one or more computer programs that are executable on a programmable system including at least one programmable processor coupled to receive data and instructions from, and to transmit data and instructions to, a data storage system, at least one input device, and at least one output device. A computer program includes a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors one of multiple processors of any kind of computer. Generally, a processor will receive instructions and data from a read-only memory or a random access memory or both. Computers include a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube), LCD (liquid crystal display) monitor, e-Ink display or another type of display for displaying information to the user and a keyboard and a pointing device such as a mouse or a trackball by which the user can provide input to the computer.

While this specification contains many specific implementation details, these should not be construed as limitations on the scope of any inventions or of what may be claimed, but rather as descriptions of features specific to particular embodiments of particular inventions.

Certain features that are described in this specification in the context of separate embodiments can also be implemented in combination in a single embodiment. Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

A number of embodiments of the invention have been described. Nevertheless, it will be understood that various modifications may be made without departing from the spirit and scope of the invention. Accordingly, other embodiments are within the scope of the following claims.

What is claimed is:

1. A method for determining a characteristic of a test cavity, the method comprising:
for each of a plurality of optical frequencies within a bandwidth of a tunable laser, measuring interference signals from the test cavity and a reference cavity having a known characteristic;

determining values for the plurality of optical frequencies from the measured interference signals of the reference cavity and the known characteristic of the reference cavity, and determining the characteristic of the test cavity using the determined values of the plurality of optical frequencies, wherein measuring the interference signals comprises sweeping through the plurality of optical frequencies within the bandwidth of the tunable laser as a function of time and measuring the interference signals for both the test cavity and the reference cavity for each of multiple, different times during the sweeping so that the measured signals for the test and reference cavities at each of the multiple, different times correspond to different ones of the plurality of optical frequencies within the bandwidth of the tunable laser.

2. The method of claim 1, wherein determining the values for the plurality of optical frequencies is based on an initial estimate for the plurality of optical frequencies.

3. The method of claim 2, wherein a single reference cavity is used and the plurality of optical frequencies is known to within half of a free spectral range of the reference cavity.

4. The method of claim 1, wherein an error in the determined characteristic of the test cavity caused by uncertainty in the values for the plurality of optical frequencies is reduced.

5. The method of claim 1, wherein the characteristic comprises a gap size within the test cavity, the reference cavity comprises a fixed reference cavity, and the known characteristic of the reference cavity comprises a gap size of the fixed reference cavity.

6. The method of claim 1, further comprising determining a second characteristic of the test cavity, the second characteristic comprises a velocity of the test cavity.

7. The method of claim 1, wherein initial values for the plurality of optical frequencies are known to within half of a free spectral range of the reference cavity, and the values for the plurality of optical frequencies are determined directly from the interference signals of the reference cavity.

8. The method of claim 1, wherein determining the characteristic of the test cavity using the determined values of the plurality of optical frequencies comprises using phase analysis of multiple overlapping segments within the plurality of optical frequency, each segment containing data points that cover a portion of the plurality of optical frequencies within the bandwidth of the tunable laser.

9. The method of claim 8, wherein a velocity of the test cavity is constant within a sampling of the data points in the segment.

10. A method for determining a characteristic of a test cavity, the method comprising:

for each of a plurality of optical frequencies within a bandwidth of a tunable laser, measuring interference signals from the test cavity and a reference cavity having a known characteristic;

determining values for the plurality of optical frequencies from the measured interference signals of the reference cavity and the known characteristic of the reference cavity, and determining the characteristic of the test cavity using the determined values of the plurality of optical frequencies, further comprising measuring interference signals from a second reference cavity having a second known characteristic, wherein determining the values for the plurality of optical frequencies comprises fitting the measured interference signals of the reference cavity and the second reference cavity obtained for each of the plurality of optical frequencies within the bandwidth of the tunable laser to a mathematical model based on the known characteristics of the reference cavity and the second reference cavity, the reference cavity and the second reference cavity having different gap sizes.

11. The method of claim 10, wherein fitting the measured interference signals of the reference cavity and the second reference cavity comprises using regression analysis of the interference signals to a mathematical model to determine the values for the plurality of optical frequencies.

12. The method of claim 11, wherein the mathematical model comprises an analytical function.

13. The method of claim 11, wherein determining the values for the plurality of optical frequencies comprises using Gauss-Newton optimization.

14. The method of claim 11, wherein determining the values for the plurality of optical frequencies comprises using Gauss-Newton optimization, and determining a Jacobian of partial derivatives of the measurement interference signals with respect to the optical frequency based on the analytical function.

15. An interferometry system for characterizing a test cavity, the system comprising:

a reference cavity having a known characteristic;

a tunable laser having a plurality of optical frequencies within a bandwidth;

optical elements to direct each of the plurality of optical frequencies within the bandwidth of the tunable laser to the test cavity and the reference cavity;

an acquisition system configured to be synchronized to the tunable laser to obtain measured interference signals from the reference cavity and the test cavity at each of the plurality of optical frequencies; and an electronic processor coupled to the acquisition system to receive the interference signals, and configured to determine values for the plurality of optical frequencies from the measured interference signals and the known characteristic, and wherein the acquisition system is configured to cause the tunable laser to sweep through the plurality of optical frequencies within the bandwidth of the tunable laser as a function of time and further configured to obtain the measured interference signals for both the test cavity and the reference cavity for each of multiple, different times during the sweeping so that the measured signals for the test and reference cavities at each of the multiple, different times correspond to different ones of the plurality of optical frequencies within the bandwidth of the tunable laser.

16. The interferometry system of claim 15, wherein the electronic processor is further configured to determine a characteristic of the test cavity based on the measured interference signals for the test cavity.

17. The system of claim 15, wherein the reference cavity has a confocal design to minimize dispersion.

18. The system of claim 15, wherein the values of the plurality of optical frequencies determined by the electronic processor has an uncertainty of less than 20 MHz for a tunable laser having a root-mean-square optical frequency variation of about 350 MHz.

19. The system of claim 15, wherein the electronic processor is configured to determine a characteristic of the test cavity using the determined values of the plurality of optical frequencies and phases extracted from data of multiple overlapping segments within the plurality of optical frequency, each segment containing data points that cover a portion of the plurality of optical frequencies within the bandwidth of the tunable laser.

20. An interferometry system for characterizing a test cavity, the system comprising:
a reference cavity having a known characteristic;
a tunable laser having a plurality of optical frequencies within a bandwidth;
optical elements to direct each of the plurality of optical frequencies within the bandwidth of the tunable laser to the test cavity and the reference cavity;
an acquisition system configured to be synchronized to the tunable laser to obtain measured interference signals from the reference cavity and the test cavity at each of the plurality of optical frequencies; and
an electronic processor coupled to the acquisition system to receive the interference signals, and configured to determine values for the plurality of optical frequencies from the measured interference signals and the known characteristic,
further comprising one or more additional reference cavities having known characteristics,
wherein the acquisition system is configured to obtain measured interference signals from a second one of the one or more additional reference cavities, and
wherein the electronic controller is configured to determine the values for the plurality of optical frequencies by fitting the measured interference signals of the reference cavity and the second reference cavity obtained for each of the plurality of optical frequencies within the bandwidth of the tunable laser to a mathematical model based on the known characteristics of the reference cavity and the second reference cavity, the reference cavity and the second reference cavity having different gap sizes.

21. The system of claim 20, further comprises an intensity monitor to compensate for high speed laser intensity fluctuations in the tunable laser.

22. The system of claim 20, further comprising a fiber distributor configured to distribute light from a tunable laser to the reference cavity and the test cavity, wherein the test cavity is remotely positioned from the fiber distributor.

* * * * *